United States Patent [19]

Kober et al.

[11] Patent Number: 5,100,492

[45] Date of Patent: Mar. 31, 1992

[54] PROCESS FOR MANUFACTURING PRINTED-CIRCUIT BOARDS HAVING RIGID AND FLEXIBLE AREAS

[75] Inventors: Horst Kober, Weinheim; Uwe Horch, Schwabisch-Gmund, both of Fed. Rep. of Germany

[73] Assignee: Firma Carl Freudenberg, Weinheim/Bergstr., Fed. Rep. of Germany

[21] Appl. No.: 464,839

[22] Filed: Jan. 16, 1990

[30] Foreign Application Priority Data

Jul. 7, 1989 [EP] European Pat. Off. ........ 89113039.5

[51] Int. Cl.⁵ .............................................. B32B 31/18
[52] U.S. Cl. ..................................... 156/250; 156/257; 156/268; 29/829; 29/830; 29/835; 361/398; 428/901

[58] Field of Search ............... 156/257, 258, 268, 250; 29/829, 830, 835; 361/386, 398; 428/901

[56] References Cited

U.S. PATENT DOCUMENTS

| | | | |
|---|---|---|---|
| 4,338,149 | 7/1982 | Quaschner | 156/250 |
| 4,800,461 | 1/1989 | Dixon et al. | 361/389 |
| 4,872,934 | 10/1989 | Kameda | 156/268 |

Primary Examiner—Caleb Weston
Attorney, Agent, or Firm—Felfe & Lynch

[57] ABSTRACT

In a process for manufacturing printed-circuit boards which have rigid and flexible areas or internal layers of printed-circuit boards, a piece of the surface is punched out to form a window in every area of the insulating layer material which is to be flexible. The punched out piece is reinserted into the punched-out window as a filling piece before laminating the compound of individual layers.

6 Claims, 2 Drawing Sheets

PROCESS FOR MANUFACTURING PRINTED-CIRCUIT BOARDS HAVING RIGID AND FLEXIBLE AREAS

BACKGROUND OF THE INVENTION

The invention relates to a process for manufacturing printed-circuit boards which have rigid and flexible areas or internal layers which have rigid and flexible areas for manufacturing multilayer printed-circuit boards. At least one rigid and at least one flexible layer of insulating material are bonded together sandwich-like by means of compound films; in this arrangement, at least the flexible layer of insulating material carries printed conductors.

Printed-circuit boards of this kind as well as the process for the manufacture thereof are known. Such a process is disclosed in the German publication OS 35 15 549; it determines that in the rigid/flexible transitional areas, the rigid layer of insulating material must be provided with continuous slots before the printing. In order to prevent chemicals and other foreign matter from intruding between the non-bonded rigid and flexible layers of material, these slots are sealed by means of a copper film. After etching the copper film, however, the slots are exposed again such that it is possible again for chemicals to enter during the subsequent process.

Furthermore, there is a risk that the flexible material is not supported in the slot area and it thus can sink into the slot which again leads to problems of low radiant exposure (wrong exposure) during the conductive pattern process. Moreover, laminating a covering film onto the flexible conductor side can cause indentations and even ruptures of the printed conductor in the slot area.

SUMMARY OF THE INVENTION

It is the object of the present invention to provide a process for manufacturing printed-circuit boards which have rigid and flexible areas or internal layers for multilayer printed-circuit boards of the aforesaid kind where a window area is provided at the site which later becomes the flexible area. In order that the manufacture of grooves or slots is not necessary, a filling piece, which can subsequently be removed and covers the window area during manufacture, is formed.

The filling piece is configured such that it can easily be removed and still provides a tight sealing of the flexible area with respect to the insulating material during the wet-chemical manufacturing process. The surface of the filling piece and the surrounding, rigid insulating material are absolutely coplanar.

The object is accomplished by punching a piece out of the rigid layer of insulating material to form a window the dimensions of which are identical to the dimensions of the flexible area. It is of no significance whether the rigid layer is already laminated with copper or not. Immediately after the punching, the punched-out piece is pressed back into the remaining window of the insulating layer such that it fits precisely. This is accomplished in a preferred embodiment of the invention without technical problems in that the ejector plate of the punching tool is configured to spring back so that the punched-out piece is completely pressed back into its original place as a filling piece.

It is understood that this operational step can be carried out by means of a separate tool without leaving the scope of the invention.

The extreme tightness of the punch-lines after punching out and reinserting the filling piece into the window would not be expected at the beginning; it probably results from the fact that when punching out material for insulating layers of printed-circuit boards, the punched edges slightly fray and, hence, result in an accurate fitting and sealing of the punched edges when the filling piece is reinserted. This fraying appears in all known insulating layer materials for printed circuit boards, such as, for example, epoxy hardened glass fabric, phenolic resin paper or polyamide-hard glass fabric. A second sealing effect is caused by surpassing the glass transitional temperature of the insulating material when laminating the layer structure; in this process, the material becomes plastic even in the punched out area and, hence, causes a sealing of the grooves without bonding the latter.

After reinserting the filling piece, the punch lines are so tight that none of the chemicals used in PCB-technology is able to penetrate; even a microscopic inspection reveals only slight indentations and bumps; therefore, the filling piece can be considered planar in its position with respect to the surrounding area.

The compound film used as an adhesive layer to bond the material layers in the rigid areas is usually cut out over what are later the flexible areas of the printed-circuit board such that the rigid insulating layer materials are not bonded to the flexible layer over the punching area. The alignment of the individual layers to each other and of the conductive pattern to the punching gap is carried out as known by means of positioning holes which are incorporated in the rigid material and in the compound film in the same operational step when the windows are punched out.

The individual layers of the panels which are laminated according to this process are bonded throughout, particularly at the edge, but this does not apply to the flexible part of the circuit. The flexible part is, hence, hermetically sealed and the external layers of the panel have a continuous surface which permits further manufacturing in the same economical way as the manufacture of rigid printed circuit boards. Once the conductive patterns are formed on the flexible layer, the rigid filling piece can be easily removed from the flexible part.

In another embodiment of the invention, the compound film is attached rigid insulating layer material before the punching. When the filling pieces are punched out of the rigid layer of insulating material, the compound film is simultaneously punched out in what later becomes the flexible area. The portion of the film on the filling pieces to be reinserted can then be easily removed. This results in a higher accuracy of fit of the compound film with respect to the punched out window, without requiring a time-consuming positioning and a separate, prior punching of the film alone in the flexible areas.

The process permits configuring any desired combination of printed-circuit board arrangments. This freedom of combining the individual layers with each other opens new possibilities of printed-circuit board design.

DETAILED DESCRIPTION OF THE PREFERRED EMBODIMENT

Figure 1:
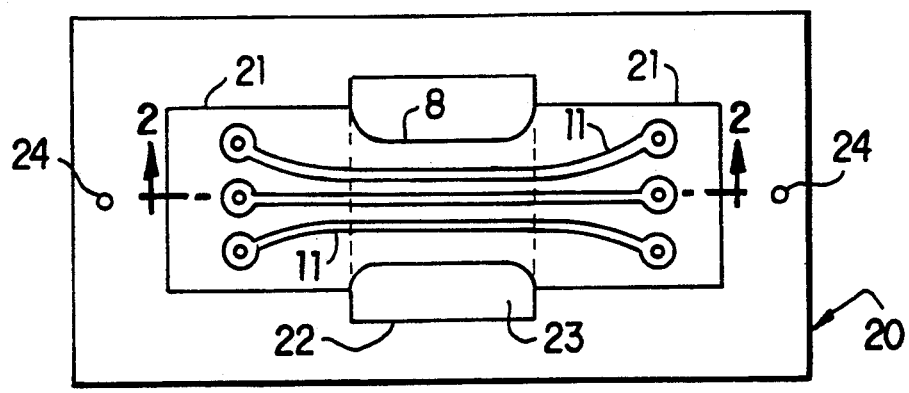
FIG. 1 is a schematic plan view of the finished composite including the conductive patterns prior to removing the printed circuit board and punched out piece.

FIG. 1 shows a panel 20 from which a printed circuit board having rigid areas 21 and piece 23 have been punched, the pieces 21, 23 being shown still in place in the panel. The rigid areas 21 are connected by a flexible area 8 passing over the punched out piece 23 and carrying circuitry 11. Holes 24 in the panel 20 serve to register a mask for forming the conductive patterns 11 to holes in the rigid areas as the patterns are formed.

Figure 2:
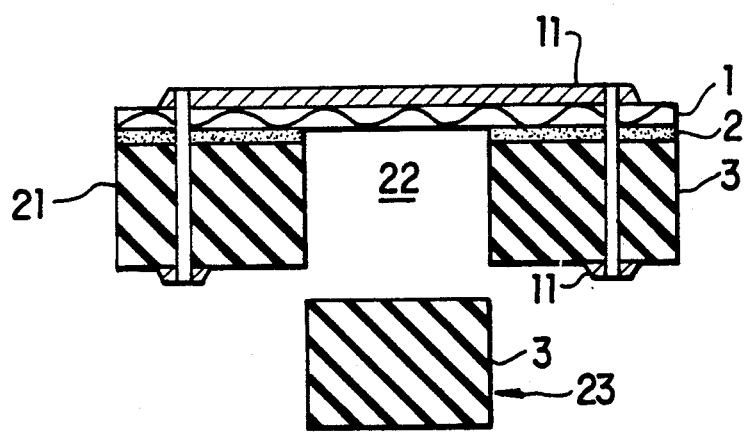
FIG. 2 is a section of the printed circuit board taken along the line 2—2 of FIG. 1 and showing the punched out piece removed therefrom.

FIG. 2 is a cross-section of the printed circuit board showing the rigid layer of insulating material 3 which forms the substrate for the rigid areas 21 and the punched out piece 23 removed therefrom to form recess 22. The rigid insulating layer 3 is preferably glass fabric reinforced epoxy resin.

Figure 3:
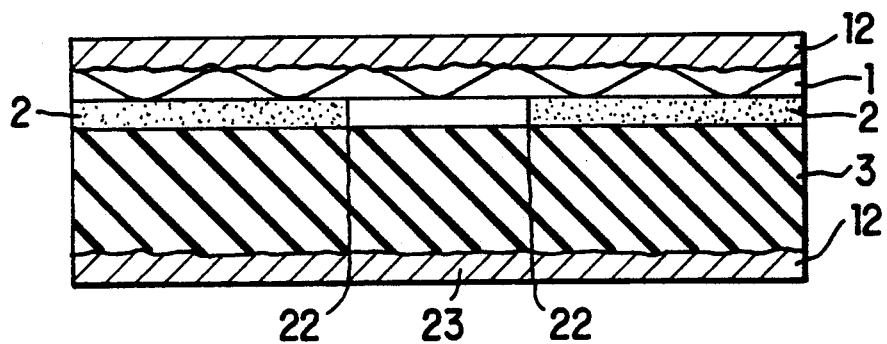
FIG. 3 is a section of a layer composite for use as an intermediate construction in a multi-layer printed circuit board.

FIG. 3 shows a more general construction wherein the flexible layer on top and the rigid layer on the bottom are provided with a copper layer 12. This construction may subsequently be etched to form circuitry with the piece 23 in place as shown. After the piece is removed, the layers can be used in a variety of multi-layer constructions.

A four-layer, symmetric layer design can be formed from a two-layer construction by means of an additional adhesive layer wherein the flexible internal layers are in the center.

The rigid layer of insulating material can be a multi-layer printed-circuit board itself such that the result is a multilayer, rigid-flexible printed-circuit board which has a flexible external layer.

The rigid-flexible structure of FIG. 3 can also be used as an internal layer of multilayer, rigid-flexible printed-circuit boards.

The flexible layer 1 is adhered to the rigid layer 3 by the adhesive layer 2 interposed therebetween. The layer 2 is preferably heat activated so that it may be bonded to the rigid layer 3 by fusion bonds with selective application of heat, as by a soldering iron.

Figure 4:
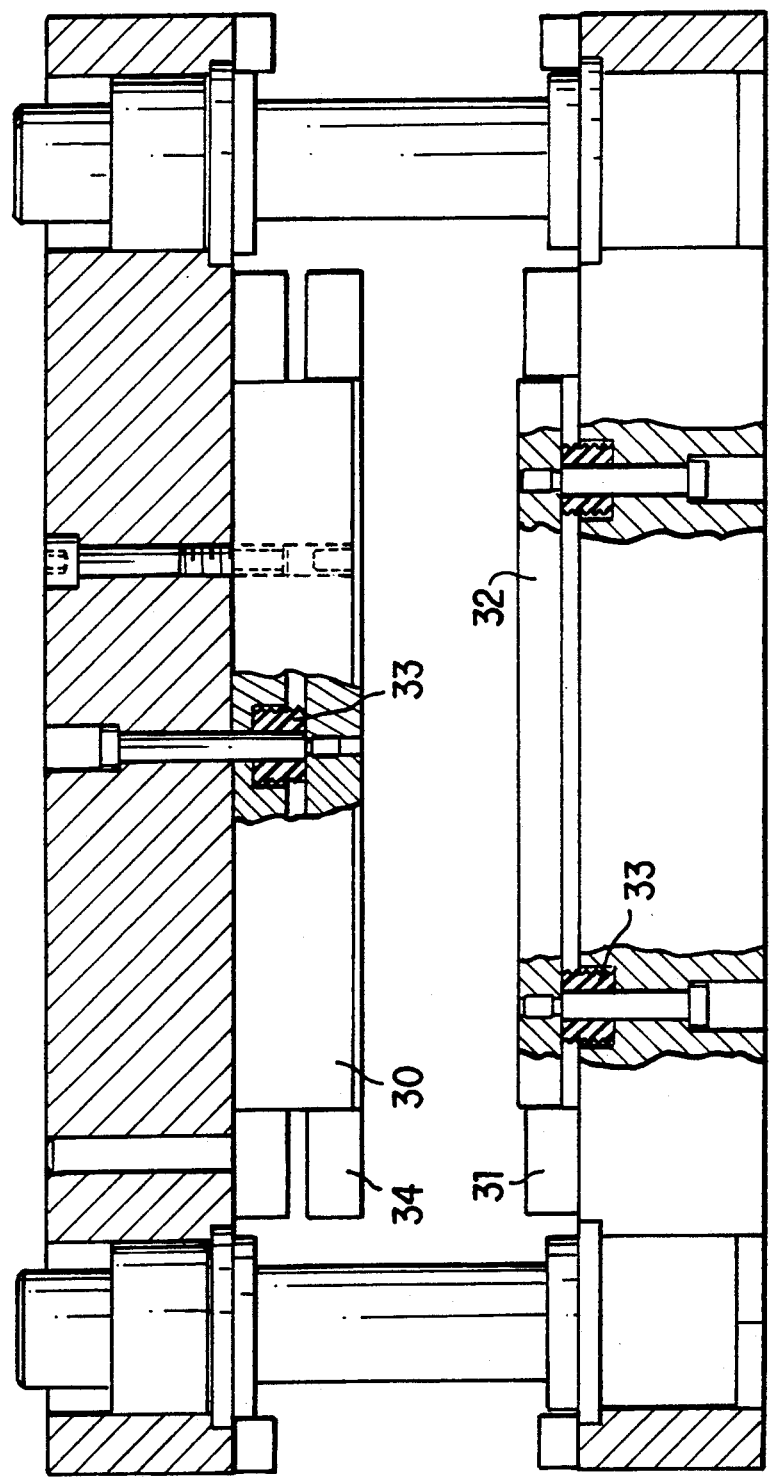
FIG. 4 is a section view of a suitable punching tool.

FIG. 4 depicts a suitable punching tool for an immediate pressing back of the punched out piece. Punching die 30 is advanced toward cutting plate 31 to cut the piece from the panel. As the die 30 retreats, the ejector plate 32, loaded by springs 33, presses the piece back into its original place while the panel is held against the cutting plate 31 by spring loaded support 34.

What is claimed is:

1. Process for manufacturing a printed circuit board of the type having a rigid area and a flexible area, aid circuit board comprising a rigid layer of insulating material and a flexible layer of insulating material bonded together by an adhesive layer, said process comprising the following steps:
   bonding said adhesive layer to said rigid layer,
   punching a piece out of the rigid layer to form a window the dimensions of which are identical to the dimensions of the flexible area, said piece having a portion of said adhesive layer bonded thereto,
   removing said portion of said adhesive layer from said piece;
   inserting said piece into the window from which it was punched, and
   inserting said piece into the window from which it was punched, and
   bonding said rigid layer to said flexible layer by means of said adhesive layer.

2. Process as in claim 1 wherein the piece is punched out with a punching tool having a spring loaded ejector plate, the piece being pressed back into the window without leaving the punching tool.

3. Process as in claim 1 wherein said adhesive layer is heat activated, said adhesive layer being selectively bonded to said rigid layer by local application of heat.

4. Process for manufacturing a printed circuit board of the type having a rigid area and a flexible area, said circuit board comprising a rigid layer of insulating material and a flexible layer of insulating material bonded together by an adhesive layer, said process comprising the following steps:
   cutting out a portion of said adhesive layer over what are later the flexible areas of the printed circuit board,
   bonding said adhesive layer to said rigid layer,
   punching a piece out of the rigid layer to form a window the dimensions of which are identical to the dimensions of the flexible area,
   inserting said piece into the window from which it was punched, and
   bonding said rigid layer to said flexible layer by means of said adhesive layer.

5. Process as in claim 4 wherein the piece is punched out with a punching tool having a spring loaded ejector plate, the piece being pressed back into the window without leaving the punching tool.

6. Process as in claim 4 wherein said adhesive layer is heat activated, said adhesive layer being selectively bonded to said rigid layer by local application of heat.

* * * * *

UNITED STATES PATENT AND TRADEMARK OFFICE
CERTIFICATE OF CORRECTION

PATENT NO. : 5,100,492

DATED : March 31, 1992

INVENTOR(S) : Horst Kober et al.

It is certified that error appears in the above-identified patent and that said Letters Patent is hereby corrected as shown below:

Column 4, line 2 (claim 1), delete "aid circuit" and insert --said circuit--.

Column 4, lines 17-18 (claim 1) should be deleted.

Signed and Sealed this

Fifth Day of October, 1993

BRUCE LEHMAN

*Attest:*

*Attesting Officer*    *Commissioner of Patents and Trademarks*